United States Patent
Akiyama

(10) Patent No.: US 6,645,834 B2
(45) Date of Patent: Nov. 11, 2003

(54) METHOD FOR MANUFACTURING ANNEALED WAFER AND ANNEALED WAFER

(75) Inventor: Shoji Akiyama, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/203,011

(22) PCT Filed: Nov. 1, 2001

(86) PCT No.: PCT/JP01/09586

§ 371 (c)(1),
(2), (4) Date: Aug. 5, 2002

(87) PCT Pub. No.: WO02/39496

PCT Pub. Date: May 16, 2002

(65) Prior Publication Data

US 2003/0003773 A1 Jan. 2, 2003

(30) Foreign Application Priority Data

Nov. 9, 2000 (JP) .......................................... 2000-341619

(51) Int. Cl.⁷ ........................ H01L 21/336; H01L 21/30; H01L 21/301; H01L 21/26; H01L 21/20
(52) U.S. Cl. ........................ 438/459; 438/308; 438/463; 438/509; 438/798; 438/799
(58) Field of Search ................................. 438/308, 459, 438/463, 509, 798, 799

(56) References Cited

U.S. PATENT DOCUMENTS 5,534,294 A * 7/1996 Kubota et al.
5,966,625 A 10/1999 Zhong et al. ................ 438/492
6,294,469 B1 * 9/2001 Kulkarni et al.
2003/0008478 A1 * 1/2003 Abe et al.

FOREIGN PATENT DOCUMENTS

| CA | 2172233 | 1/2001 |
|---|---|---|
| JP | H05-152179 | 6/1993 |
| JP | H05-347256 | 12/1993 |
| JP | H08-264401 | 10/1996 |
| JP | H08-264402 | 10/1996 |
| JP | H08-264780 | 10/1996 |
| JP | H08-321443 | 12/1996 |
| JP | H11-121407 | 4/1999 |

OTHER PUBLICATIONS

International Patent Search dated Jan. 15, 2002.

* cited by examiner

*Primary Examiner*—John F. Niebling
*Assistant Examiner*—Stanetta Isaac
(74) *Attorney, Agent, or Firm*—Rader Fishman & Grauer

(57) ABSTRACT

Provided is a manufacturing process for an annealed wafer capable of elucidating a relationship between a tilt angle from a (100) plane of a wafer to be annealed and haze to set optimal tilt angles for suppression of haze and to improve a characteristic of a device from the annealed wafer as a result of the suppression of haze. A silicon mirror wafer having a surface orientation with a tilt angle in the range of 0.1 degree<θ<0.2 degree from a (100) plane or a plane equivalent thereto is heat treated in an atmosphere of hydrogen gas, an inert gas, nitrogen gas or a mixed gas thereof.

4 Claims, 3 Drawing Sheets

METHOD FOR MANUFACTURING ANNEALED WAFER AND ANNEALED WAFER

TECHNICAL FIELD

The present invention relates to a manufacturing process for an annealed wafer obtained by heat-treating a silicon mirror wafer, and an annealed wafer.

BACKGROUND ART

In order to acquire an excellent oxide film dielectric breakdown strength characteristic, there has been adopted a method wherein a silicon wafer is subjected to high temperature hydrogen ($H_2$) annealing or high temperature argon (Ar) annealing. These high temperature annealed wafers, however, have been known to be inferior to an ordinary mirror finished wafer (a mirror wafer) in a surface roughness index named haze.

This is because silicon atoms on a surface of a silicon wafer are rearranged so as to assume a lower surface energy state in high temperature annealing thereof, leading to irregularities named atomic steps stepwise generated on the surface as a result of sensitive reflection of a crystallographic orientation of the surface. The haze degrades a device characteristic; therefore a silicon wafer with a lower haze value is more highly evaluated in terms of quality. Such an inclination is said to become more explicit with smaller minimum dimensions of design rules and a smaller thickness of a gate oxide film.

As a method for reducing haze on such an annealed wafer, a technique is disclosed in JP A 93-152179 in which a silicon wafer with a sliced surface tilted from a silicon (100) plane by an angle of 0.2 to 2.0 degrees is annealed in a reductive gas atmosphere.

On the other hand, another technique of the kind is disclosed in JP A 96-321443, in which a semiconductor wafer having a vicinal (100) surface with a tilt angle of 0.1 degree or less is heat treated in a atmosphere including at least one of $H_2$ gas and Ar gas at a prescribed temperature for a prescribed time.

The above described JP A 93-152179 has a main feature that since a silicon wafer shows haze in rainbow colors on a surface thereof when the silicon wafer with a tilt angle of 0.2 degree or less from a silicon (100) plane is annealed in the reductive atmosphere, the tilt angle from the silicon (100) plane before the annealing is set to the range of from 0.2 to 2.0 degrees.

On the other hand, in the above described JP A 96-321443, it is described that occurrence of haze in annealing is suppressed with a tilt angle from a (100) plane of being 0.1 degree or less.

That is, it is found that there has been a conflicting ambivalence between main features of the prior art techniques, concerning a relationship between a tilt angle from a (100) plane of a wafer to be annealed and haze generated on a surface thereof by the annealing.

DISCLOSURE OF THE INVENTION

It is accordingly an object of the present invention to provide a manufacturing process for an annealed wafer capable of elucidating a relationship between a tilt angle from a (100) plane of a wafer to be annealed and haze to set optimal tilt angles for suppression of haze and to improve a characteristic of a device as a result of the suppression of haze.

In order to achieve the above object, a manufacturing process for an annealed wafer of the present invention comprises the steps of: preparing a silicon mirror wafer having a surface orientation with a tilt angle (an off angle) θ in the range of 0.1 degree <θ<0.2 degree from a (100) plane or a plane equivalent thereto; and heat-treating the silicon mirror wafer in an atmosphere of hydrogen gas, an inert gas, nitrogen gas or a mixed gas thereof.

The silicon mirror wafer can be manufactured from a wafer prepared by slicing a silicon single crystal ingot so as to cause a tilt angle θ of a slicing plane to fall in the range of 0.1 degree <θ<0.2 degree from a (100) plane or a plane equivalent thereto.

An annealed wafer manufactured by such a manufacturing process has a surface orientation with a tilt angle θ in the range of 0.1 degree <θ<0.2 degree from a (100) plane or a plane equivalent thereto, a low haze level and a high oxide film dielectric breakdown strength.

The inventors of the present invention have conducted a detailed research on a relationship between a tilt angle from a (100) plane of a wafer to be annealed and haze; as a result, obtained novel findings that a haze level varies largely depending on the change in observation mode for haze (a spatial frequency in measurement) from Experimental Examples 1 and 2 described later, which has lead to completion of the invention.

BEST MODE FOR CARRYING OUT THE INVENTION

Figure 1:
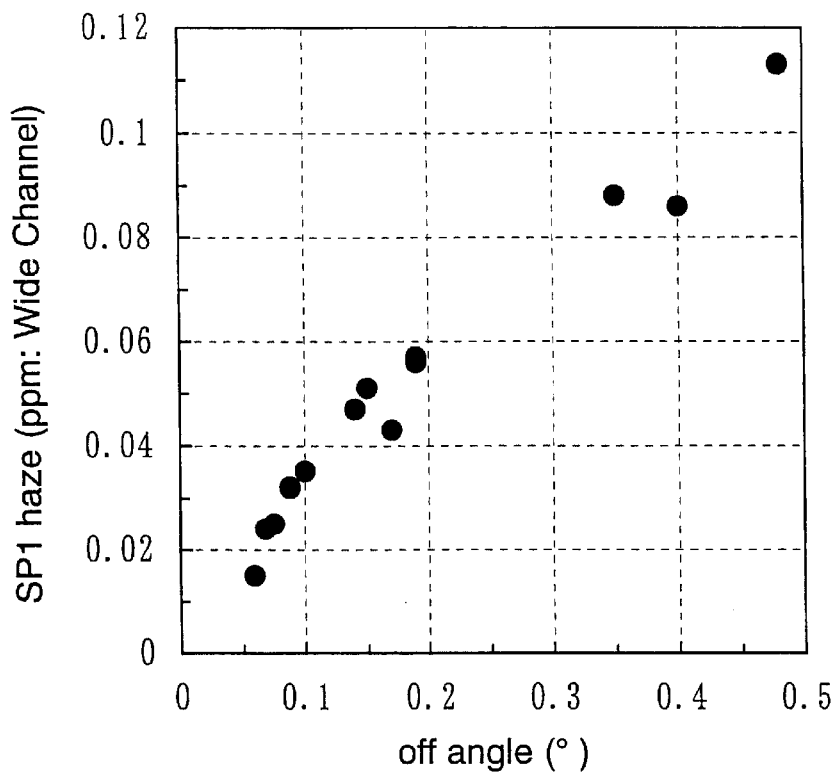
FIG. 1 is a graph showing a relationship between an off angle of a wafer and a haze value after annealing in Experimental Example 1.

Description will be given of embodiments of the present invention below.

Manufacture of a Silicon Mirror Wafer with an Off Angle θ of 0.1 degree <θ<0.2 degree 1) A silicon single crystal ingot having a crystallographic orientation of <100> is grown by means of a Czochralski (CZ) method. In this case, with a seed crystal having a central axis tilted from a crystallographic orientation of <100> by an angle in the range of from 0.1 degree to several degrees, a crystal may be pulled so as to have a pulling direction tilted from a crystallographic orientation of <100> by an angle in the range of from 0.1 degree to several degrees.

2) A pulled silicon single crystal ingot is subjected to cylindrical grinding, formation of an orientation flat (or a notch) and others; thereafter, such a shaped silicon single crystal ingot is positioned precisely in such a way that a slicing plane therefor assumes an orientation tilted from a (100) plane or a plane equivalent thereto such as (010), (001), ($\bar{1}$00), (0$\bar{1}$0) or (00$\bar{1}$) by a tilt angle θ in the range of 0.1 degree <θ<0.2 degree using an X ray crystallographic orientation measuring apparatus, and is sliced using a wire saw, an inner diameter saw or the like. Note that the tilt angle θ is an angle of a wafer surface with respect to a (100) plane or a plane equivalent thereto and a direction of tilting is not specific.

3) According to an ordinary process, thus sliced wafers are subjected to chamfering, lapping, etching, mirror polishing and others to manufacture silicon mirror wafers.

Heat Treatment Using Hydrogen Gas and/or Argon Gas

A silicon wafer prepared by slicing a silicon single crystal ingot grown in a CZ method has defects called grown-in defects therein, which exercise harmful effects on device characteristics if being present in a device formation region in the vicinity of a surface of the wafer. Therefore, in order to eliminate the grown-in defects in the vicinity of the wafer surface, heat treatment (annealing) is performed in an atmosphere of hydrogen gas, an inert gas such as argon gas and helium gas, nitrogen gas, or a mixed gas thereof.

As for annealing atmospheres, there can be exemplified 100% hydrogen gas, 100% argon gas, a mixed gas atmosphere composed of hydrogen and argon at a hydrogen concentration equal to or lower than the lower explosion limit (4%), or an atmosphere of a mixture with hydrogen and argon at respective arbitrary concentrations, which have preferably a high effect of eliminating grown-in defects in the vicinity of a wafer surface.

An annealing temperature is preferably set in the range of from 1000° C. to 1300° C. and an annealing time is preferably set in the range of from 0.5 to 10 hr. In conditions where a temperature is in the range of from 1150° C. to 1250° C. and an annealing time is in the range of from 1 to 5 hr, a great effect of eliminating grown-in defects can be enjoyed and suppression can be comparatively exerted on problems of durability of a heat treatment furnace, heavy metal contamination and others.

As for heat treatment furnaces, there can be exemplified a heater heating type batch heat treatment furnace performing heat treatment as described above, and in addition thereto a single wafer RTA (Rapid Thermal Annealing) apparatus of a lamp heating type or the like. Preferable heat treatment conditions for eliminating grown-in defects in case of an RTA apparatus in use are at a temperature in the range of from 1000 to 1350° C. and for a time in the range of from 1 to 60 sec.

With any of the heat treatment applied, as far as a wafer has a tilted surface according to the present invention, a haze level on the wafer after the heat treatment can be reduced lower with a higher oxide film dielectric breakdown strength compared with a prior art practice.

EXAMPLES

Further detailed description will be given of the present invention below, giving Experimental Examples having led to completion of the present invention.

Experimental Example 1

In this experimental example, investigation was conducted into a relationship between a tilt angle from a (100) plane of a wafer surface orientation and haze on the wafer after high temperature annealing. An annealing furnace used in this example was one made by Tokyo Electron Limited with a trade name of UL-260-10H, and a haze evaluation apparatus was one made by KIA-Tencor Corp. with a trade name of Surfcan SP1. A measuring mode for haze adopted in this example was of Wide channel (a mode in which irregularities with a low spatial frequency and a short wavelength are observed). The heat treatment was performed in an atmosphere of 100% argon, at 1150° C. and for 4 hr.

Figure 5:
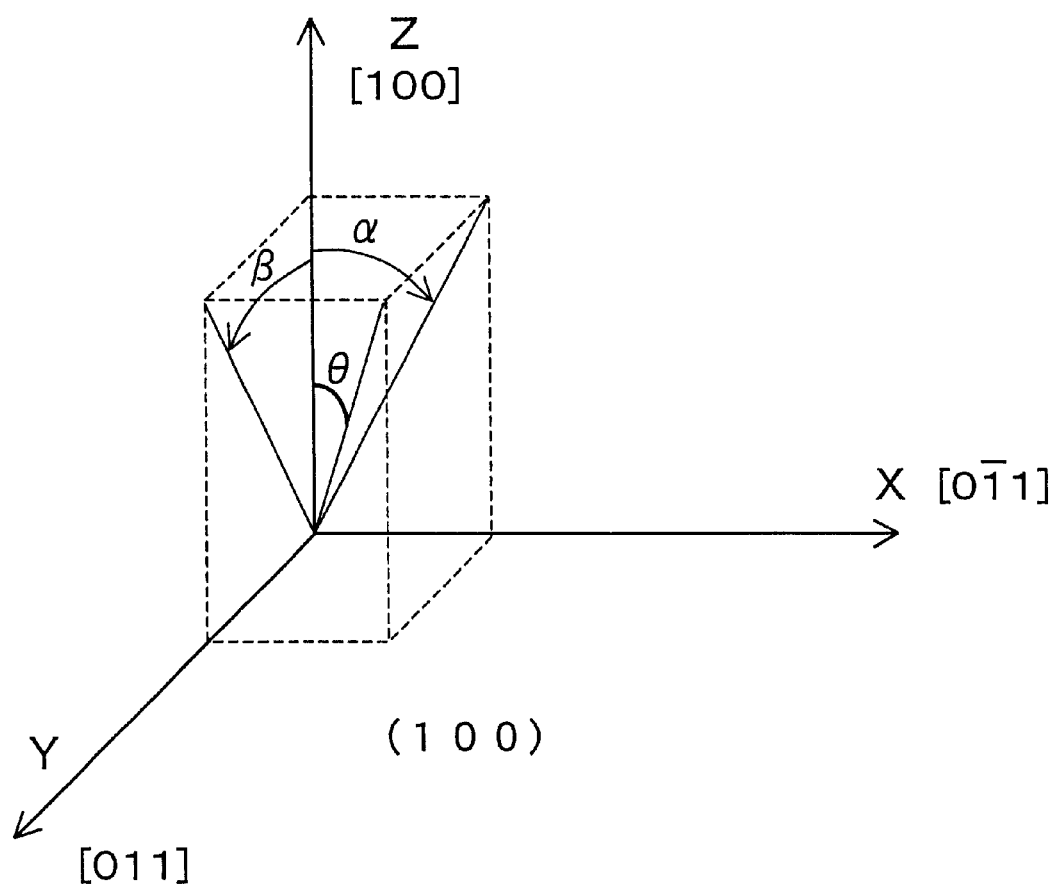
FIG. 5 is an explanatory view for showing that an off angle of a wafer is a composite value θ of a tilt angle α to the X-axis direction and a tilt angle β to the Y-axis direction.

In FIG. 1, there is shown a graph in which a tilt angle θ from a (100) plane (a composite angle of a tilt angle α to the X-axis [0$\bar{1}$1] direction and a tilt angle β to the Y-axis [011] direction: see FIG. 5) of a wafer in use is plotted with the abscissa and the ordinate is assigned to a haze value after the annealing. It is understood from FIG. 1 that with decrease in a tilt angle (an off angle θ) from a (100) plane, a lower haze value is observed. This shows a similar result to that in JP A 96-321443. Only with these data available, a conclusion would be that the decrease the off angle, the lower the haze level. In addition, it is found that with a tilt angle of less than 0.2 degree, a haze level of 0.06 ppm or less is obtained.

Experimental Example 2

In this experimental example, a haze value was measured in a mode of Narrow channel of Surfscan SP1 described above. The Narrow channel mode is a mode in which irregularities with a higher spatial frequency and a longer wavelength compared with the Wide channel mode and undulation components are observed. The other conditions were the same as those of Experimental Example 1. Measurement results are shown in FIG. 2.

Figure 2:
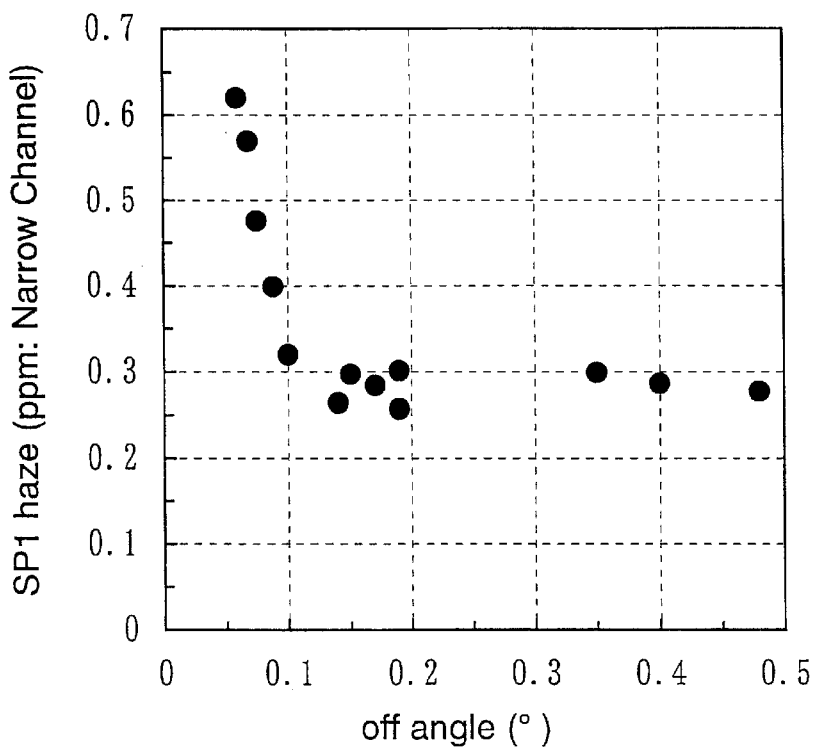
FIG. 2 is a graph showing a relationship between an off angle of a wafer and a haze value after annealing in Experimental Example 2.

It was observed from FIG. 2 that a tendency is observed that with an off angle of 0.1 degree or less, a haze value measured in the Narrow channel mode is extremely increased. This result can be considered to correspond to a phenomenon in JP A 93-152179 that a haze in rainbow colors was observed on a wafer having a tilt angle of 0.2 degree or less from a (100) plane after its annealing.

Although a cause for generation of haze in the mode of the Narrow channel is uncertain, it was found that as a result, undulation components with long wavelengths increase on a wafer surface in case of an off angle of 0.1 degree or less, and haze observed in the Narrow channel mode rises very much. Haze observed in the Narrow channel will be problematic in the future when flatness of a long period required on a silicon wafer is severer. If haze observed in the Narrow channel mode is at a very high level when a haze inspection is performed in the Narrow channel mode in order to evaluate the flatness of a long period, a problem also arises that other surface defects such as particles are hard to be observed. Therefore, it is important to prevent an increase in haze observed in the Narrow channel mode, for which it was understood that a tilt angle exceeding 0.1 degree was necessary.

Experimental Example 3

Then, wafers having respective various off angles were subjected to annealing similar to Experimental Example 1 to prepare annealed wafers with respective various haze values. The wafers each were used for an oxide film dielectric breakdown strength test (TDDB measurement). A good chip yield in the TDDB measurement is a proportion of chips having an oxide film dielectric breakdown strength of 1C/cm$^2$ or higher under conditions of a gate oxide film thickness of 5.0 nm, a gate area of 4 mm$^2$, a stress current value of 0.01 A/cm$^2$ and at room temperature.

The reason why the oxide film thickness is 5.0 nm is that it has been known through experiences that the thinner the oxide film, the more sensitive to a surface state.

Figure 3:
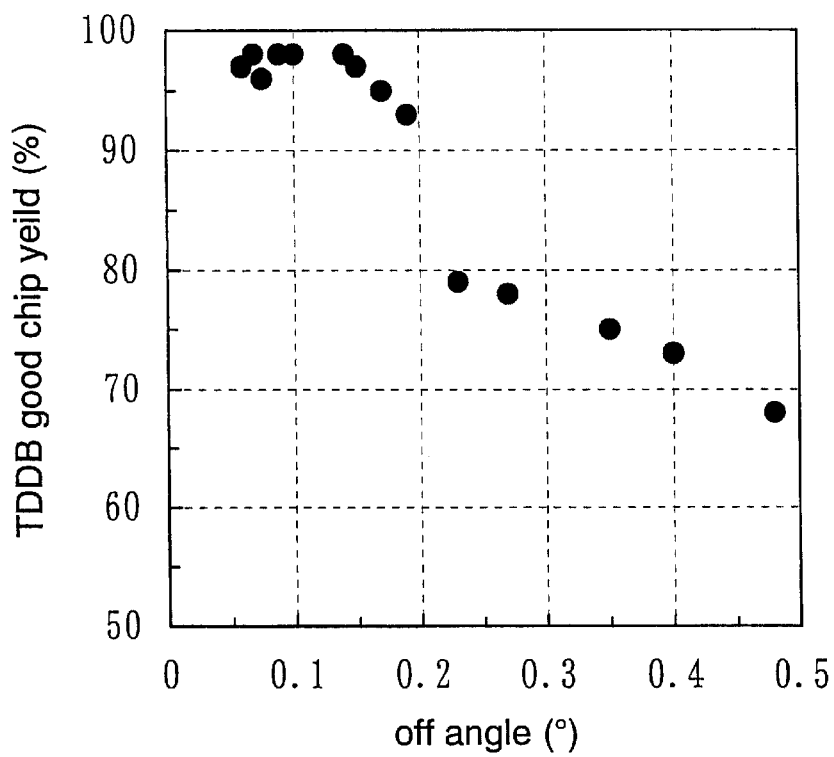
FIG. 3 is a graph showing a relationship between an off angle of a wafer and a TDDB good chip yield in Experimental Example 3.

In FIG. 3, there is shown a graph showing an off angle of a wafer vs. a good chip yield. It is found from FIG. 3 that with an off angle of 0.2 degree or more, a good chip yield is 80% or less. Wafers having off angles less than 0.2 degree showed percentage values of almost 100%. Accordingly, proper off angles obtained from this experimental example are less than 0.2 degree.

Experimental Example 4

Wafers were annealed in a similar manner to Experimental Example 3 to prepare wafers having respective various haze values. The wafers each were used for an oxide film dielectric breakdown strength test (TZDB measurement). A good chip yield in the TZDB measurement is a proportion of chips having an oxide film dielectric breakdown strength of 8 MV/cm or higher under conditions of a gate oxide film thickness of 5.0 nm, a gate area of 8 mm$^2$, a current density in decision of 1 mA/cm$^2$ and at room temperature.

Figure 4:
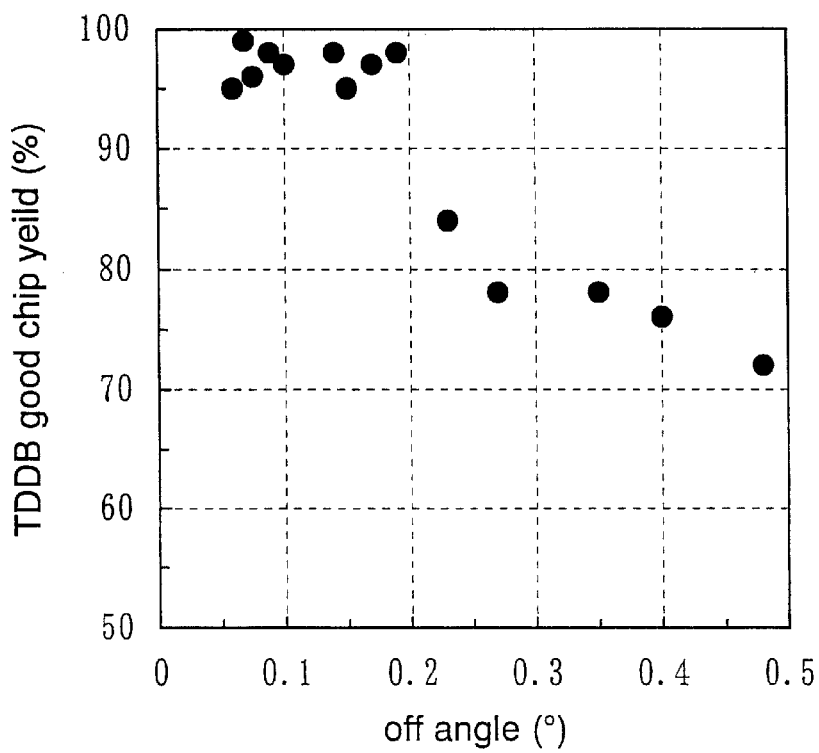
FIG. 4 is a graph showing a relationship between an off angle of a wafer and a TZDB good chip yield in Experimental Example 4.

The reason why the oxide film thickness is 5.0 nm is that it has been known through experiences that the thinner the oxide film, the more sensitive to a surface state. In FIG. 4, there is shown a graph showing an off angle of a wafer vs. a good chip yield. It is found from FIG. 4 that in excess of an off angle of 0.2 degree, a good chip yield is 85% or less. Wafers having off angles less than 0.2 degree showed values of almost 100%. Accordingly, proper off angles obtained from this experimental example are less than 0.2 degree.

Considering collectively above Experimental Examples 1 to 4, it is concluded that in order to acquire optimal haze values, an off angle $\theta$ of a wafer is required to fall within the range of 0.1 degree $<\theta<0.2$ degree. Furthermore, a proper range of off angles were confirmed through similar experiments to Experimental Examples 1 to 4 except for the fact that the heat treatment was performed in argon atmosphere including hydrogen gas at a content of 3%, at 1200° C. and for 1 hr. It was found that there were observed tendencies similar to FIGS. 1 to 4 wherein an off angle is suitably in the range of 0.1 degree $<\theta<0.2$ degree.

Capability of Exploitation in Industry

According to the present invention, as described above, a high quality annealed wafer with a very low level of a haze value can be manufactured.

What is claimed is:

1. A manufacturing process for an annealed wafer comprising the steps of:

preparing a silicon mirror wafer having a surface orientation with a tilt angle $\theta$ in the range of 0.1 degree$<\theta<0.2$ degree from a (100) plane or a plane equivalent thereto; and heat-treating the silicon mirror wafer in an atmosphere of hydrogen gas, an inert gas, nitrogen gas or a mixed gas thereof.

2. The manufacturing process for an annealed wafer according to claim 1, wherein the silicon mirror wafer is manufactured from a wafer prepared by slicing a silicon single crystal ingot so as to cause a tilt angle $\theta$ of a slicing plane to fall in the range of 0.1 degree$<\theta<0.2$ degree from a (100) plane or a plane equivalent thereto.

3. An annealed wafer manufactured by the manufacturing process according to claim 1 or 2 having a surface orientation with a tilt angle $\theta$ to fall in the range of 0.1 degree$<\theta<0.2$ degree from a (100) plane or a plane equivalent thereto.

4. An annealed wafer manufactured by the manufacturing process according to claim 2 having a surface orientation with a tilt angle $\theta$ to fall in the range of 0.1 degree $<\theta<0.2$ degree from a (100) plane or a plane equivalent thereto.

* * * * *